(12) United States Patent
Matsushita

(10) Patent No.: US 11,473,858 B2
(45) Date of Patent: Oct. 18, 2022

(54) HEAT-DISSIPATING MEMBER AND ELECTRONIC DEVICE USING SAME

(71) Applicant: KYOCERA CORPORATION, Kyoto (JP)

(72) Inventor: Kouji Matsushita, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 739 days.

(21) Appl. No.: 16/344,842

(22) PCT Filed: Oct. 26, 2017

(86) PCT No.: PCT/JP2017/038734
§ 371 (c)(1),
(2) Date: Apr. 25, 2019

(87) PCT Pub. No.: WO2018/079666
PCT Pub. Date: May 3, 2018

(65) Prior Publication Data
US 2020/0049433 A1 Feb. 13, 2020

(30) Foreign Application Priority Data
Oct. 27, 2016 (JP) .............................. JP2016-210731

(51) Int. Cl.
F28F 21/04 (2006.01)
C04B 35/111 (2006.01)
C04B 35/626 (2006.01)
C04B 35/634 (2006.01)
C04B 35/64 (2006.01)
C09K 5/14 (2006.01)
H05K 7/20 (2006.01)

(52) U.S. Cl.
CPC ............ *F28F 21/04* (2013.01); *C04B 35/111* (2013.01); *C04B 35/6261* (2013.01); *C04B 35/62655* (2013.01); *C04B 35/63424* (2013.01); *C04B 35/64* (2013.01); *C09K 5/14* (2013.01); *H05K 7/20509* (2013.01); *C04B 2235/3206* (2013.01); *C04B 2235/3208* (2013.01); *C04B 2235/3217* (2013.01); *C04B 2235/3418* (2013.01); *C04B 2235/5436* (2013.01); *C04B 2235/6567* (2013.01); *C04B 2235/786* (2013.01); *C04B 2235/788* (2013.01)

(58) Field of Classification Search
None
See application file for complete search history.

(56) References Cited

FOREIGN PATENT DOCUMENTS

| CN | 103492345 A | 1/2014 |
|---|---|---|
| JP | 2012-222339 A | 11/2012 |

*Primary Examiner* — Jeffrey D Washville
(74) *Attorney, Agent, or Firm* — Viering, Jentschura & Partner MBB

(57) ABSTRACT

A heat-dissipating member includes aluminum oxide ceramics that includes crystal particles of aluminum oxide. The aluminum oxide ceramics includes 98 mass % or higher of aluminum in terms of $Al_2O_3$ with respect to 100 mass % of all constituents. The crystal particles have an average equivalent circle diameter of 1.6 µm or more and 2.4 µm or less. An equivalent circle diameter cumulative distribution curve of the crystal particles has a first diameter at 10 cumulative percent and a second diameter at 90 cumulative percent that is different from the first diameter by 2.1 µm or more and 4.2 µm or less.

9 Claims, 2 Drawing Sheets

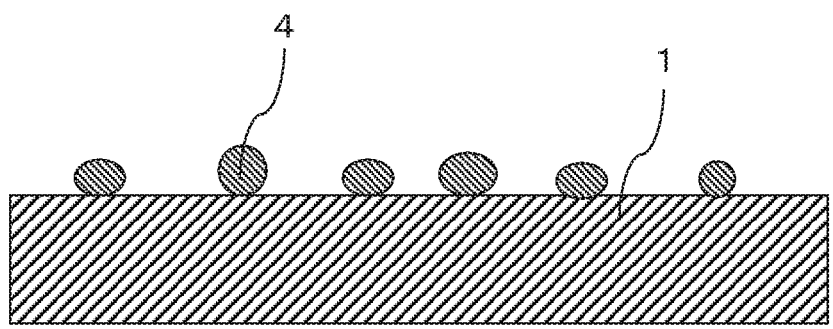
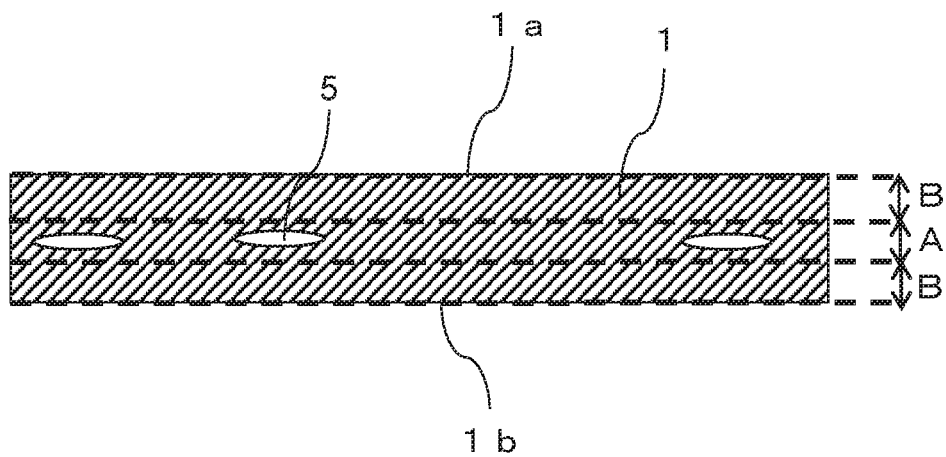

HEAT-DISSIPATING MEMBER AND ELECTRONIC DEVICE USING SAME

CROSS-REFERENCES

This application is a national stage application based on PCT Application No. PCT/JP2017/038734 filed on Oct. 26, 2017, which claims priority to Japanese Application No. 2016-210731, filed on Oct. 27, 2016, the contents of which are entirely incorporated herein by reference.

TECHNICAL FIELD

The present disclosure relates to a heat-dissipating member and an electronic device using the same.

BACKGROUND

Electronic devices may be equipped with various electronic components, such as a semiconductor element, a heat-generating element, and a Peltier element, mounted on a ceramic-made heat-dissipating member. Aluminum oxide ceramics may be used for forming a heat-dissipating member; aluminum oxide ceramics have a relatively high thermal conductivity among all ceramics, is capable of reducing electromagnetic radiation-caused damage to electronic components, and is inexpensive both in manufacturing cost and in raw material cost.

For example, Japanese Unexamined Patent Publication JP-A 2012-222339 discusses a ceramic heat dissipator module that may be used to lower the temperature of a heat-generating element. This ceramic heat dissipator module may include a ceramic heat dissipator module main body, and, as the composition of the ceramic heat dissipator module main body, aluminum oxide may be contained therein substantially in an amount of 70% or higher on a weight percentage basis.

SUMMARY

In a non-limiting aspect of the disclosure, a heat-dissipating member may include aluminum oxide ceramics that includes crystal particles of aluminum oxide. The aluminum oxide ceramics may include a 98 mass % or higher of aluminum in terms of $Al_2O_3$ with respect to 100 mass % of all constituents. The aluminum oxide crystal particles may have an average in equivalent circle diameter of 1.6 μm or more and 2.4 μm or less. An equivalent circle diameter cumulative distribution curve of the crystal particles may have a first diameter at 10 cumulative percent and a second diameter at 90 cumulative percent that is different from the first diameter by 2.1 μm or more and 4.2 μm or less.

BRIEF DESCRIPTION OF DRAWINGS

FIG. 4 is a sectional view of the heat-dissipating member shown in FIG. 3; and

FIG. 5 is a sectional view showing another example of the heat-dissipating member according to a non-limiting aspect of the present disclosure.

DETAILED DESCRIPTION

Recent advances in high-power electronic component development have led to an increase in the amount of heat generated in the operation of such an electronic component. As a natural consequence of this trend, heat-dissipating members are required to exhibit higher thermal conductivity than ever.

Moreover, recent advances in downsized electronic device development have aroused demand for a low-profile heat-dissipating member which constitutes such an electronic device. Making a heat-dissipating member lower in profile cannot be achieved without imparting high mechanical strength to the heat-dissipating member in itself.

A heat-dissipating member according to a non-limiting aspect of the present disclosure exhibits both great thermal conductivity and great mechanical strength. The following describes the details of the heat-dissipating member according to a non-limiting aspect of the present disclosure and an electronic device that employs the heat-dissipating member with reference to drawings.

Figure 1:
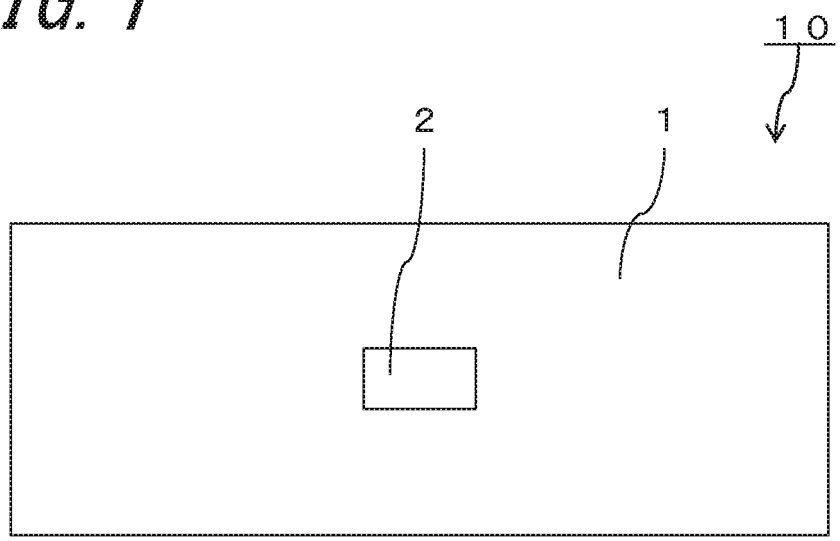
FIG. 1 is a plan view showing an example of an electronic device according to a non-limiting aspect of the present disclosure.
Figure 2:
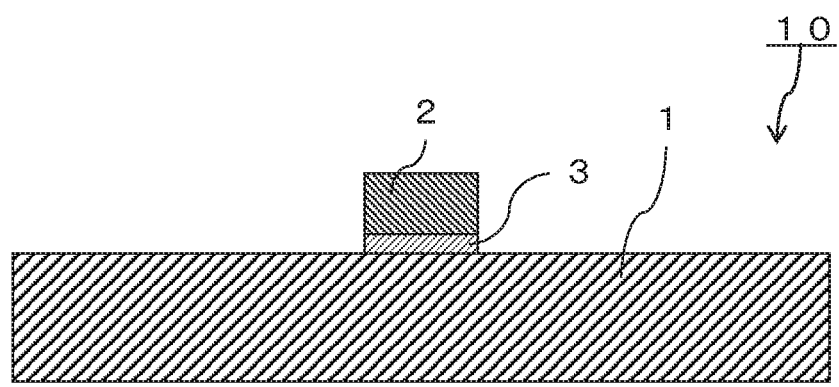
FIG. 2 is a sectional view of the electronic device shown in FIG. 1.

As shown in FIGS. 1 and 2, an electronic device 10 according to a non-limiting aspect of the present disclosure includes a heat-dissipating member 1 and an electronic component 2 located on the heat-dissipating member 1.

Examples of the electronic component 2 include a semiconductor element, a Peltier element, a light-emitting element, a resistor, a capacitor, an inductance, and a switching power supply. The electronic component 2 may be further provided with a transformer, a relay, a motor, and others.

As shown in FIG. 2, the electronic component 2 may be joined to the heat-dissipating member 1 via a joining material 3. In the electronic component 2 joined via the joining material 3 to the heat-dissipating member 1, heat generated in the operation of the electronic component 2 can be transmitted to the heat-dissipating member 1. Non-limiting examples of the joining material 3 include a metal brazing material, solder, a thermosetting resin adhesive, grease, and double-faced tape. When using the thermosetting resin adhesive, for example, a metallic filler or an inorganic filler may be added thereto to promote thermal conductivity.

The heat-dissipating member 1 according to a non-limiting aspect of the present disclosure is made of aluminum oxide ceramics containing aluminum oxide crystal particles (hereafter also referred to simply as "crystal particles") having an $Al_2O_3$-equivalent aluminum content of 98% by mass or higher on the basis of 100% by mass of the sum total of constituent components. Moreover, in the heat-dissipating member 1 according to a non-limiting aspect of the present disclosure, the crystal particles have an average in equivalent circle diameter of 1.6 μm or more and 2.4 μm or less, and, in an equivalent circle diameter cumulative distribution curve of crystal particles, the difference between an equivalent circle diameter corresponding to 10 cumulative percent (d10) and an equivalent circle diameter corresponding to 90 cumulative percent (d90) falls within the range of 2.1 μm or more and 4.2 μm or less.

As to the crystal particle size d10, with the equivalent circle diameter values of individual crystal particles sorted in ascending numeric order, with respect to the smallest value as a reference, the value of equivalent circle diameter assigned to 10 percent of all the crystal particles is defined as d10. For example, assuming that the number of crystal particles is 100, then the tenth equivalent circle diameter value counting from the smallest equivalent circle diameter value is defined as the crystal particle size d10.

On the other hand, as to the crystal particle size d90, with the equivalent circle diameter values of individual crystal particles sorted in ascending numeric order, with respect to the smallest value as a reference, the value of equivalent circle diameter assigned to 90 percent of all the crystal particles is defined as d90. For example, assuming that the number of crystal particles is 100, then the ninetieth equivalent circle diameter value counting from the smallest equivalent circle diameter value is defined as the crystal particle size d90.

As employed herein, an equivalent circle diameter refers to a diameter of a circle which is the equivalent of the area of a crystal particle.

The heat-dissipating member 1 according to a non-limiting aspect of the present disclosure fulfills the conditions thus far described, and thus exhibits both great thermal conductivity and great mechanical strength. The excellence both in thermal conductivity and in mechanical strength of the heat-dissipating member 1 according to a non-limiting aspect of the present disclosure accrues from its characteristics such that high aluminum oxide content limits the content of, for example, a compound which may cause a decline in thermal conductivity, and moderate variations in equivalent circle diameter from crystal particle to crystal particle reduce the occurrence of a gap between crystal particles. A thermal conductivity which measures up to a level of 28 W or higher/m·K in accordance with a laser flash method as set forth in JIS R 1611-2010 may be regarded as great thermal conductivity. Moreover, a three-point bending strength which measures up to a value of 400 MPa or higher in conformance with JIS R 1601-2008 may be regarded as great mechanical strength.

When the $Al_2O_3$-equivalent aluminum content is less than 98% by mass on the basis of 100% by mass of the sum total of constituent components, for example, the content of a compound which may cause a decline in thermal conductivity is increased, causing failure of the heat-dissipating member to exhibit great thermal conductivity.

Moreover, when the average in equivalent circle diameter of the crystal particles is less than 1.6 μm, the proportion in area of crystal grain boundary is increased, causing failure of the heat-dissipating member to exhibit great thermal conductivity. On the other hand, when the average in equivalent circle diameter of the crystal particles exceeds 2.4 μm, the crystal particles are apt to fall off, causing failure of the heat-dissipating member to exhibit great mechanical strength.

When the difference between the crystal particle sizes d10 and d90 is less than 2.1 μm, a gap is apt to occur between the crystal particles, causing failure of the heat-dissipating member to exhibit great mechanical strength. Compounding the problem, the resulting gap lowers thermal conductivity. On the other hand, when the difference between the crystal particle sizes d10 and d90 exceeds 4.2 μm, the proportion in area of crystal grain boundary is increased, causing failure of the heat-dissipating member to exhibit great thermal conductivity. Compounding the problem, the crystal particles are apt to fall off, causing a decrease in mechanical strength.

The content of aluminum oxide in the heat-dissipating member 1 according to a non-limiting aspect of the present disclosure can be determined by calculation in the following manner. First, quantitative analysis of aluminum (Al) contained in the heat-dissipating member 1 is performed using an ICP emission spectrophotometer (ICP) or an X-ray fluorescence analyzer (XRF). Then, the measured aluminum content is converted into aluminum oxide content ($Al_2O_3$).

Moreover, the average in equivalent circle diameter of the crystal particles and the crystal particle sizes d10 and d90 can be determined by calculation in the following manner. First, the heat-dissipating member 1 according to a non-limiting aspect of the present disclosure is cut. The cut surface of the heat-dissipating member 1 is polished by a cross-section polisher (CP) or subjected to a focused ion beam (FIB) process to obtain a work surface. The work surface is chemically etched with hydrofluoric acid or the like, or heat-treated at temperatures between 1400° C. to 1500° C. to obtain an observation surface.

Next, surface analysis is performed on the observation surface by an electron probe microanalyzer (EPMA). On the basis of color mapping obtained by the surface analysis, the presence of aluminum is identified, and, in the locations where aluminum is present, a crystal particle bearing oxygen is defined as the aluminum oxide crystal particle.

Next, a photograph of a part corresponding to the range subjected to the above-described surface analysis is taken by a scanning electron microscope (SEM). The aluminum oxide crystal particle shown in this photograph is edged with a black line. After the edging, the photograph is subjected to image analysis in accordance with the particle analysis method applied to Image Analysis Software "AZO-KUN" (trademark) manufactured by Asahi Kasei Engineering Corporation (in what follows, the term "Image Analysis Software "AZO-KUN"" refers to the image analysis software manufactured by Asahi Kasei Engineering Corporation throughout the description). As to the conditions specified in the analysis using "AZO-KUN", for example, crystal particle brightness is set at "high", image binarization mode is set at "automatic", and shading function is set at "ON". Through the particle analysis, on the basis of the measured equivalent circle diameter of each crystal particle, the average in equivalent circle diameter of the crystal particles and the crystal particle sizes d10 and d90 are determined by calculation.

In the heat-dissipating member 1 according to a non-limiting aspect of the present disclosure, the crystal particle size d10 may fall within the range of 0.6 μm or more and 1.0 μm or less, and, the crystal particle size d90 may fall within the range of 3.4 μm or more and 3.9 μm or less.

Moreover, in the heat-dissipating member 1 according to a non-limiting aspect of the present disclosure, the average in aspect ratio of crystal particles having an equivalent circle diameter of 3.0 μm or more may fall within the range of 1.25 or more and 1.80 or less. As employed herein, a crystal-particle aspect ratio refers to a value obtained by dividing the major axis of the crystal particle by the minor axis thereof. The major axis of the crystal particle corresponds to the maximum diametrical length of the crystal particle as viewed in section. The minor axis of the crystal particle corresponds to the length of a straight line extending perpendicularly to a line segment representing the major axis while intersecting the line segment at the center of the line segment. With the fulfillment of the above condition, a gap is less likely to occur between crystal particles, and thus the heat-dissipating member 1 according to a non-limiting aspect of the present disclosure exhibits even greater mechanical strength.

The average in aspect ratio of the crystal particles having an equivalent circle diameter of 3.0 μm or more can be determined by calculation in the following manner. As is the case with the described method to determine the average in equivalent circle diameter of the crystal particles and the crystal particle sizes d10 and d90, first, image analysis is performed in accordance with the particle analysis method applied to "AZO-KUN". The image analysis involves calculation of the major and minor axes of each crystal particle, so that crystal particles having an equivalent circle diameter of 3.0 μm or more can be selected from among all the crystal particles. The aspect ratio of each crystal particle is obtained by dividing the major axis by the minor axis, and, averaging of all the aspect ratio data is performed to determine the average in aspect ratio.

Moreover, in the heat-dissipating member 1 according to a non-limiting aspect of the present disclosure, silicon, calcium, and magnesium, and more specifically, $SiO_2$-equivalent silicon, CaO-equivalent calcium, and MgO-equivalent magnesium, may be contained in total amounts within the range of 0.5% by mass or more and 2.0% by mass or less on the basis of 100% by mass of the sum total of the components constituting the heat-dissipating member 1. The heat-dissipating member 1 according to the present application is, when containing the described amounts of silicon, calcium, and magnesium, capable of exhibiting even greater mechanical strength.

Moreover, in the heat-dissipating member 1 according to a non-limiting aspect of the present disclosure, the mass ratio of CaO-equivalent calcium to $SiO_2$-equivalent silicon, expressed as $CaO/SiO_2$, may fall within the range of 0.2 or more and 0.8 or less. With the fulfillment of such a condition, the heat-dissipating member 1 according to a non-limiting aspect of the present disclosure contains densely arranged crystal particles, and thus exhibits even greater mechanical strength.

The $SiO_2$-equivalent silicon content, the CaO-equivalent calcium content, and the MgO-equivalent magnesium content in the heat-dissipating member 1 according to a non-limiting aspect of the present disclosure can be determined by calculation in a manner similar to the above-described method to determine the content of aluminum oxide. More specifically, first, quantitative analysis of silicon (Si), calcium (Ca), and magnesium (Mg) contained in the heat-dissipating member 1 is performed using the ICP or XRF. Then, the measured silicon content, calcium content, and magnesium content are converted into silicon oxide content ($SiO_2$), calcium oxide content (CaO), and magnesium oxide content (MgO), respectively.

Figure 3:
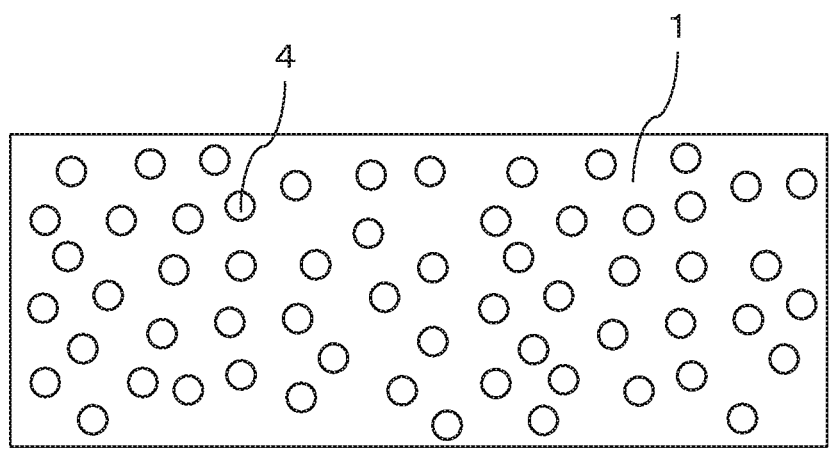
FIG. 3 is a plan view showing an example of a heat-dissipating member according to a non-limiting aspect of the present disclosure.

Moreover, as shown in FIGS. 3 and 4, the heat-dissipating member 1 according to a non-limiting aspect of the present disclosure may be configured to have a plurality of projections 4 at a surface thereof. As shown in FIG. 4, the projection 4 refers to a portion which protrudes beyond the line connecting together the projection 4—free areas of the surface of the heat-dissipating member 1. With the fulfillment of the above condition, in the heat-dissipating member 1 according to a non-limiting aspect of the present disclosure, the plurality of projections 4 facilitate dissipation of heat generated in the operation of the electronic component 2.

Moreover, in the heat-dissipating member 1 according to a non-limiting aspect of the present disclosure, while the projection 4 may be made of any suitable material, use can be made of aluminum oxide ceramics. With the fulfillment of such a condition, the projection 4 is made of the same material as that used for the heat-dissipating member 1, and thus suffers little from separation caused by a difference in thermal expansion. This makes it possible to sustain the property of being able to dissipate heat generated in the operation of the electronic component 2.

The projection 4 made of aluminum oxide ceramics is taken to mean the projection 4 having an $Al_2O_3$-equivalent aluminum content of 98% by mass or higher on the basis of 100% by mass of the sum total of the components constituting the projection 4. The content of aluminum oxide in the projection 4 can be determined by calculation in a manner similar to the above-described method to determine the content of aluminum oxide in the heat-dissipating member 1. More specifically, a plurality of projections 4 are cut from the heat-dissipating member 1, and they are pulverized into particles that are subjected to quantitative analysis of aluminum using the ICP or XRF. Then, the measured aluminum content is converted into aluminum oxide content.

Moreover, in the heat-dissipating member 1 according to a non-limiting aspect of the present disclosure, the average in diameter of the projections 4 as seen in a top view may fall within the range of 10 μm or more and 40 μm or less. As employed herein, a top view refers to a plan view of the projection 4—bearing surface of the heat-dissipating member 1. With the fulfillment of the above condition, the projection 4 is less likely to separate from the heat-dissipating member 1, and, the surface area of the projection 4 can be increased. This enables the heat-dissipating member 1 according to a non-limiting aspect of the present disclosure to dissipate heat generated in the operation of the electronic component 2 more readily.

The average in diameter of the projections 4 as seen in a top view can be determined by calculation using the following method. As shown in FIG. 3, first, a photograph of the projection 4—bearing surface from above the top of the surface is taken by the SEM. The projection 4 shown in this photograph is edged with a black line. After the edging, the photograph is subjected to image analysis in accordance with the particle analysis method applied to Image Analysis Software "AZO-KUN". The average in equivalent circle diameter of the projections 4 determined by calculation in the image analysis is defined as the average in diameter of the projections 4 as seen in a top view. As to the conditions specified in the analysis using "AZO-KUN", for example, crystal particle brightness is set at "high", image binarization mode is set at "automatic", and shading function is set at "ON".

While the projection 4 may be formed to have any given top plan configuration, for example, as shown in FIG. 3, a circular configuration may be adopted.

Moreover, the heat-dissipating member 1 according to a non-limiting aspect of the present disclosure has the form of a plate-like body, and, as shown in FIG. 5, the plate-like body may contain voids 5. In this case, given that the plate-like body is equally divided into three segments, namely a central segmented region A and opposite side segmented regions B, in the thickness direction, then the voids 5 are scattered so that the central segmented region A can contain more voids 5 than each side segmented region B.

As shown in FIG. 5, in the section of the heat-dissipating member 1 in the thickness direction, given that the range extending from one surface 1a of the heat-dissipating member 1 to the other surface 1b thereof is equally divided into three segments, then centrally-located one of the three segments corresponds to the central segmented region A.

Moreover, in the section of the heat-dissipating member 1 in the thickness direction, given that the range extending from the surface 1a to the surface 1b of the heat-dissipating member 1 is equally divided into three segments, then the segment located closer to the surface 1a and the segment located closer to the surface 1b correspond to the side segmented regions B. In other words, the side segmented region B may be a part of the thickness-wise section of the heat-dissipating member 1 other than the part thereof defining the central segmented region A.

When heat generated in the operation of the electronic component 2 is transmitted to the heat-dissipating member 1, the heat propagates through a region having high thermal conductivity. In light of this, with the fulfillment of the above condition, the central segmented region A bears many voids 5 that are lower in thermal conductivity than aluminum oxide, and thus the heat is readily conducted in a direction perpendicular to the thickness direction of the heat-dissipating member 1 in the central region A, and can consequently be dissipated from throughout the heat-dissipating member 1.

The abundance of the voids 5 in each of the central segmented region A and the side segmented regions B of the heat-dissipating member 1 can be determined in the following manner. First, the heat-dissipating member 1 is cut in the thickness direction to obtain an observation surface by the same process as that of calculating the average in equivalent circle diameter of the crystal particles and the crystal particle sizes d10 and d90 as described earlier. Next, a photograph of the observation surface is taken by the SEM. Then, color is applied to the voids 5 shown in the photograph. After the coloring of the voids 5, the photograph is subjected to image analysis in accordance with the particle analysis method applied to Image Analysis Software "AZO-KUN". The image analysis involves calculation of the area ratio of the voids 5 to the total area of each of the central segmented region A and the side segmented regions B. A comparison of the void 5 area proportions allows the checking of whether the central segmented region A contains more voids 5 than the side segmented regions B. As to the conditions specified in the analysis using "AZO-KUN", for example, crystal particle brightness is set at "high", image binarization mode is set at "automatic", and shading function is set at "ON".

The following describes an example of a method for manufacturing the heat-dissipating member 1 according a non-limiting aspect of to the present disclosure.

First, aluminum oxide ($Al_2O_3$) powder, and, calcium carbonate ($CaCO_3$) powder, magnesium hydroxide ($Mg(OH)_2$) powder, and silicon oxide ($SiO_2$) powder which serve as sintering aids, are prepared.

As the aluminum oxide powder, three types are prepared: one set for d50 of 0.2 µm; one set for d50 of 0.6 µm; and one set for d50 of 2.1 µm. "d50" refers to an equivalent circle diameter corresponding to 50 cumulative percent in an equivalent circle diameter cumulative distribution curve of aluminum oxide powder. After weighing a predetermined amount of each of the three types of aluminum oxide powder, pulverization and mixing of them are effected to produce a primary raw material powder in which d50 falls within the range of 1.2 µm or more and 2.0 µm or less, and the difference between d10 and d90 falls within the range of 1.2 µm or more and 3.6 µm or less.

Next, predetermined amounts of, respectively, the primary raw material powder and the powdery sintering aids are weighed out so that $Al_2O_3$-equivalent aluminum content can be higher than or equal to 98% by mass on the basis of 100% by mass of the sum total of the components constituting the heat-dissipating member 1. Particularly, predetermined amounts of the primary raw material powder and the sintering aid powders may be weighed out so that the total content of $SiO_2$-equivalent silicon, CaO-equivalent calcium, and MgO-equivalent magnesium can fall within the range of 0.5% by mass or more and 2.0% by mass or less on the basis of 100% by mass of the sum total of the components constituting the heat-dissipating member 1. Moreover, the proportions of the individual sintering aid powders may be adjusted so that the mass ratio of CaO-equivalent calcium to $SiO_2$-equivalent silicon, expressed as $CaO/SiO_2$, can fall within the range of 0.2 or more and 0.8 or less.

In a stirrer, the primary raw material powder and the sintering aid powders, and also, a binder such as water-soluble acrylic resin added in an amount of from 3 parts by mass or more and 10 parts by mass or less and a solvent added in an amount of 100 parts by mass with respect to 100 parts by mass of the sum total of the primary raw material powder and the sintering aid powders, are mixed and stirred together to obtain a slurry.

The slurry is shaped into a sheet by a doctor blade method. Alternatively, the slurry is spray-dried into granules by a spray-granulating apparatus (spray dryer), and, a sheet is made from the granules by a roll-compaction method.

Next, the sheet is worked into a molded body having a predetermined product shape by die stamping or lasering. At this time, formation of slits in the molded body makes it possible to obtain a plurality of heat-dissipating members 1 from one molded body, and thereby achieve improvement in mass production of the heat-dissipating member 1.

The molded body so obtained is put in an air (oxidizing)-atmosphere firing furnace (for example, a roller tunnel furnace, an atmosphere furnace of batch type, or a pusher tunnel furnace), and is fired at maximum temperatures ranging from 1540° C. or higher to 1650° C. or lower while being retained under retention time within the range of 1 hour or longer to 6 hours or shorter. In this way, the heat-dissipating member 1 according to a non-limiting aspect of the present disclosure is obtained. To obtain the heat-dissipating member 1 according to a non-limiting aspect of the present disclosure in which the average in aspect ratio of the crystal particles having the equivalent circle diameter of 3.0 µm or more falls within the range of 1.25 or more and 1.80 or less, the firing is performed at maximum temperatures ranging from 1560° C. or higher to 1630° C. or lower.

Moreover, to obtain the heat-dissipating member 1 having a plurality of projections 4 at a surface thereof, a plurality of portions that become the projections 4 are formed at the surface of the yet-to-be-fired molded body. For example, the portion which becomes the projection 4 may be formed by pressing a recess-bearing mold against the molded body or by cutting away part of the surface of the molded body by lasering or blasting. Alternatively, the portion may be formed by sifting powder for forming the projection 4 through a sieve or the like over the surface of the molded body. In another alternative, a solvent and others are added to the powder for forming the projection 4 to prepare a slurry which is applied to the surface of the molded body with a brush or a roller, for example.

To obtain the projection 4 made of aluminum oxide ceramics, aluminum oxide powder is used as the powder for forming the projection 4. Moreover, to obtain the projections 4 having an average particle diameter of 10 µm or more and 40 µm or less as seen in a top view, as the projection 4—forming powder, for example, it is possible to use spherical powder particles that will have an average diameter within the above-described range subsequent to a firing process.

Moreover, to obtain the heat-dissipating member 1 in plate-like body form containing the voids 5 scattered so that, given that the plate-like body is equally divided into three segmented regions in the thickness direction, the central segmented region can contain more voids 5 than each side segmented region, the molded body is produced by preparing two plate-like bodies, applying an adhesive solution to one of the plate-like bodies, except for void 5—forming areas, and bonding the two plate-like bodies together.

Moreover, the electronic device 10 according to a non-limiting aspect of the present disclosure is obtained by mounting the electronic component 2 on the heat-dissipating member 1 according to a non-limiting aspect of the present disclosure. The heat-dissipating member 1 and the electronic component 2 may be joined together via the joining material 3 such for example as a metal brazing material, solder, a thermosetting resin adhesive, grease, or double-faced tape.

The following specifically describes examples according to a non-limiting aspect of the present disclosure, it being understood that the application a non-limiting aspect of the present disclosure is not limited to the following examples.

Example 1

Samples that differ from one another in equivalent circle diameter and d10-to-d90 difference of crystal particles were produced to measure their thermal conductivity and mechanical strength and make evaluations.

As aluminum oxide powder, three types were prepared: one set for d50 of 0.2 μm; one set for d50 of 0.6 μm; and one set for d50 of 2.1 μm. As sintering aids, calcium carbonate powder, magnesium hydroxide powder, and silicon oxide powder were prepared.

After weighing a predetermined amount of each of the three types of aluminum oxide powder, pulverization and mixing of them were performed to produce primary raw material powders having different values of d10, d50, and d90 as shown in Table 1.

Next, predetermined amounts of, respectively, the primary raw material powder and the sintering aid powders were weighed out so that aluminum oxide can be contained in an amount as shown in Table 1 on the basis of 100% by mass of the sum total of the components constituting each of the fired samples. Note that the weighed amounts of, respectively, the sintering aid powders were determined so that $SiO_2$-equivalent silicon, CaO-equivalent calcium, and MgO-equivalent magnesium can be contained in a 5:3:2 ratio in each of the fired samples.

In a stirrer, the primary raw material powder and the sintering aid powders, and, water-soluble acrylic resin added as a binder in an amount of 7 parts by mass and water added as a solvent in an amount of 100 parts by mass with respect to 100 parts by mass of the sum total of the primary raw material powder and the sintering aid powders have been mixed and stirred together to obtain a slurry.

The slurry thus obtained has been spray-dried into granules by the spray dryer, and a sheet was made from the granules by the roll-compaction method.

A molded body of the sheet was put in an air-atmosphere firing furnace, and fired at a maximum temperature of 1580° C. while being retained for 4 hours to complete the samples.

Next, for each sample, the average in equivalent circle diameter of crystal particles and the crystal particle sizes d10 and d90 were determined by calculation in the following manner. To begin with, each sample was cut. Then, the plane of section of the sample was polished by the CP, and heat-treated at a temperature of 1500° C. to obtain an observation surface. The observation surface was subjected to surface analysis using the EPMA to identify the locations of aluminum oxide crystal particles.

Next, a photograph of a part corresponding to the range subjected to the above-described surface analysis was taken by the SEM. The crystal particle shown in this photograph was edged with a black line, and, the photograph was subjected to image analysis in accordance with the particle analysis method applied to Image Analysis Software "AZO-KUN". As to the conditions specified in the analysis using "AZO-KUN", crystal particle brightness was set at "high", image binarization mode was set at "automatic", and shading function was set at "ON". Through the particle analysis, on the basis of the measured equivalent circle diameter of each crystal particle, the average in equivalent circle diameter of the crystal particles was calculated. Moreover, with the equivalent circle diameter values of individual crystal particles sorted in ascending numeric order, with respect to the smallest value as a reference, the value of equivalent circle diameter assigned to 10 percent of all the crystal particles was defined as d10. On the other hand, with the equivalent circle diameter values of individual crystal particles sorted in ascending numeric order, with respect to the smallest value as a reference, the value of equivalent circle diameter assigned to 90 percent of all the crystal particles was defined as d90.

Next, each sample has been ground to obtain a sample A which is 10 mm in diameter and 2 mm in thickness, and a sample B which is 4 mm in width, 3 mm in thickness, and 30 mm in length.

The sample A was tested for thermal conductivity in accordance with a laser flash method as set forth in JIS R 1611-2010.

Moreover, the sample B was tested for three-point bending strength in conformance with JIS R 1601-2008.

TABLE 1

| | | | | | Heat-dissipating member | | | | | |
|---|---|---|---|---|---|---|---|---|---|---|
| | Primary raw material powder | | | $Al_2O_3$ | Average in equivalent circle | | | d10-to-d90 | Three-point bending | Thermal |
| Sample No. | d10 (μm) | d50 (μm) | d90 (μm) | (% by mass) | diameter (μm) | d10 (μm) | d90 (μm) | difference (μm) | strength (MPa) | conductivity (W/m · K) |
| 1 | 0.9 | 2.1 | 3.1 | 99.0 | 2.2 | 1.4 | 3.3 | 1.9 | 380 | 29 |
| 2 | 0.8 | 1.9 | 3.0 | 99.0 | 2.2 | 1.1 | 3.2 | 2.1 | 440 | 30 |
| 3 | 0.6 | 1.8 | 3.8 | 99.0 | 2.2 | 0.8 | 3.9 | 3.1 | 460 | 30 |
| 4 | 0.6 | 1.8 | 3.8 | 98.0 | 2.2 | 0.8 | 3.9 | 3.1 | 430 | 29 |
| 5 | 0.6 | 1.8 | 3.8 | 97.5 | 2.3 | 0.9 | 4.0 | 3.1 | 410 | 27 |
| 6 | 0.4 | 1.5 | 4.0 | 99.0 | 2.2 | 0.6 | 4.8 | 4.2 | 410 | 30 |
| 7 | 0.2 | 1.3 | 4.1 | 99.0 | 2.2 | 0.3 | 4.6 | 4.3 | 380 | 28 |

TABLE 1-continued

| | Primary raw material powder | | | $Al_2O_3$ | Heat-dissipating member | | | | | |
| | | | | | Average in equivalent circle | | | d10-to-d90 | Three-point bending | Thermal |
| Sample No. | d10 (μm) | d50 (μm) | d90 (μm) | (% by mass) | diameter (μm) | d10 (μm) | d90 (μm) | difference (μm) | strength (MPa) | conductivity (W/m·K) |
|---|---|---|---|---|---|---|---|---|---|---|
| 8 | 1.0 | 2.2 | 4.1 | 99.0 | 2.5 | 1.5 | 4.3 | 2.8 | 380 | 30 |
| 9 | 0.5 | 2.0 | 3.1 | 99.0 | 2.4 | 0.7 | 3.4 | 2.7 | 430 | 30 |
| 10 | 0.7 | 1.2 | 2.8 | 99.0 | 1.6 | 1.0 | 3.4 | 2.4 | 410 | 29 |
| 11 | 0.7 | 1.2 | 2.8 | 98.0 | 1.6 | 1.0 | 3.4 | 2.4 | 400 | 28 |
| 12 | 0.8 | 1.1 | 2.8 | 99.0 | 1.5 | 1.1 | 3.4 | 2.3 | 400 | 27 |

It will be seen from Table 1 that Sample Nos. 2 to 4, Sample No. 6, and Sample Nos. 9 to 11 have three-point bending strength of 400 MPa or higher and thermal conductivity of 28 W/m·K or higher. This result shows that the excellence both in thermal conductivity and in mechanical strength can be attained by fulfilling the following conditions: the constituent aluminum oxide ceramics has $Al_2O_3$-equivalent aluminum content of 98% by mass or higher; an average in equivalent circle diameter of the crystal particles falls within the range of 1.6 μm or more and 2.4 μm or less in; and the difference between d10 and d90 in the crystal particles falls within the range of 2.1 μm or more and 4.2 μm or less.

Example 2

Samples that differ from one another in the average in aspect ratio of crystal particles having an equivalent circle diameter of 3.0 μm or more were produced to measure their thermal conductivity and mechanical strength and make evaluations. Sample Nos. 13 to 18 were each produced basically in the same manner as that for forming Sample No. 3 of Example 1, except that the maximum temperature for a firing step in the production process was set at the value as shown in Table 2. Note that Sample No. 16 was produced in the same manner as that for forming Sample No. 3 of Example 1.

Next, for each sample, the average in aspect ratio of the crystal particles having the equivalent circle diameter of 3.0 μm or more was determined by calculation in the following manner. As in the case of Example 1, a photograph showing crystal particles each edged with a black line was subjected to image analysis in accordance with the particle analysis method applied to "AZO-KUN". For each of the crystal particles having the equivalent circle diameter of 3.0 μm or more identified through the image analysis, the aspect ratio was determined by dividing particle's major axis by particle's minor axis, and, averaging of all the aspect ratio data was performed to determine the average in aspect ratio.

The samples were tested for thermal conductivity and three-point bending strength in accordance with methods similar to those adopted in Example 1. The result is given in Table 2. In Table 2, The aspect ratio of each crystal particle having an equivalent circle diameter of 3.0 μm or more is simply indicated as "Aspect ratio".

TABLE 2

| Sample No. | Maximum temperature (° C.) | Aspect ratio | Three-point bending strength (MPa) | Thermal conductivity (W/m·K) |
|---|---|---|---|---|
| 13 | 1650 | 1.85 | 420 | 29 |
| 14 | 1630 | 1.80 | 450 | 30 |
| 15 | 1600 | 1.69 | 470 | 30 |
| 16 | 1580 | 1.48 | 460 | 30 |
| 17 | 1560 | 1.25 | 440 | 30 |
| 18 | 1540 | 1.21 | 420 | 29 |

It will be seen from Table 2 that Sample Nos. 14 to 17 have three-point bending strength of 440 MPa or higher. This result shows that even greater mechanical strength can be attained by fulfilling the condition that the average in aspect ratio of the crystal particles having the equivalent circle diameter of 3.0 μm or more falls within the range of 1.25 or more and 1.80 or less.

Example 3

Samples that differ from one another in silicon content, calcium content, and magnesium content were produced to measure their thermal conductivity and mechanical strength and make evaluations. Sample Nos. 19 to 28 were each produced basically in the same manner as that for forming Sample No. 3 of Example 1, except that predetermined amounts of, respectively, the primary raw material powder and the sintering aid powders were weighed out so that each of $SiO_2$-equivalent silicon, CaO-equivalent calcium, and MgO-equivalent magnesium can be contained in the amount as shown in Table 3 on the basis of 100% by mass of the sum total of the components constituting each of the fired samples. Note that Sample No. 23 was produced in the same manner as that for forming Sample No. 3 of Example 1.

The samples were tested for thermal conductivity and three-point bending strength in accordance with methods similar to those adopted in Example 1. The result is given in Table 3.

TABLE 3

| Sample No. | Al$_2$O$_3$ (% by mass) | SiO$_2$ (% by mass) | CaO (% by mass) | MgO (% by mass) | Sum total of sintering-aid content (% by mass) | CaO/SiO$_2$ | Three-point bending strength (MPa) | Thermal conductivity (W/m · K) |
|---|---|---|---|---|---|---|---|---|
| 19 | 99.6 | 0.1 | 0.2 | 0.1 | 0.4 | 2.0 | 400 | 29 |
| 20 | 99.5 | 0.2 | 0.2 | 0.1 | 0.5 | 1.0 | 420 | 31 |
| 21 | 99.0 | 0.4 | 0.4 | 0.2 | 1.0 | 1.0 | 420 | 30 |
| 22 | 99.0 | 0.5 | 0.4 | 0.1 | 1.0 | 0.8 | 440 | 30 |
| 23 | 99.0 | 0.5 | 0.3 | 0.2 | 1.0 | 0.6 | 460 | 30 |
| 24 | 99.0 | 0.5 | 0.1 | 0.4 | 1.0 | 0.2 | 460 | 30 |
| 25 | 98.6 | 0.5 | 0.2 | 0.7 | 1.4 | 0.4 | 450 | 29 |
| 26 | 99.0 | 0.7 | 0.1 | 0.2 | 1.0 | 0.1 | 430 | 29 |
| 27 | 98.0 | 1.4 | 0.2 | 0.4 | 2.0 | 0.1 | 420 | 28 |
| 28 | 97.8 | 1.5 | 0.2 | 0.5 | 2.2 | 0.1 | 400 | 27 |

It will be seen from Table 3 that Sample Nos. 20 to 27 have three-point bending strength of 420 MPa or higher. This result shows that great mechanical strength can be attained by fulfilling the condition that the total content of SiO$_2$-equivalent silicon, CaO-equivalent calcium, and MgO-equivalent magnesium falls within the range of 0.5% by mass or more and 2.0% by mass or less.

Moreover, among Sample Nos. 20 to 27, Sample Nos. 22 to 25 in particular have three-point bending strength of 440 MPa or higher. This result shows that even greater mechanical strength can be attained by fulfilling the condition that the mass ratio CaO/SiO$_2$ falls within the range of 0.2 or more and 0.8 or less.

While the heat-dissipating member in various non-limiting aspects of the present disclosure have been described and illustrated above, the heat-dissipating member of the present disclosure are not limited to the above non-limiting aspects. It is, of course, possible to make any arbitrary ones insofar as they do not depart from the gist of the present disclosure.

REFERENCE SIGNS LIST

1: Heat-dissipating member
2: Electronic component
3: Joining material
4: Projection
5: Void
10: Electronic device

The invention claimed is:

1. A heat-dissipating member, comprising aluminum oxide ceramics:
   comprising crystal particles of aluminum oxide having an average equivalent circle diameter of 1.6 μm or more and 2.4 μm or less; and
   being 98 mass % or higher of aluminum in terms of Al$_2$O$_3$ with respect to 100 mass % of all constituents, wherein
   an equivalent circle diameter cumulative distribution curve of the crystal particles has:
      a first diameter at 10 cumulative percent; and
      a second diameter at 90 cumulative percent that is different from the first diameter by 2.1 μm or more and 4.2 μm or less.

2. The heat-dissipating member according to claim 1, wherein an average aspect ratio of crystal particles having an equivalent circle diameter of 3.0 μm or more is 1.25 or more and 1.80 or less.

3. The heat-dissipating member according to claim 1, wherein
   the aluminum oxide ceramics further comprise: silicon, calcium, and magnesium, and a total content of silicon, calcium, and magnesium in terms of SiO$_2$, CaO, and MgO, respectively, is 0.5 mass % or more and 2.0 mass % or less with respect to 100 mass % of the all constituents.

4. The heat-dissipating member according to claim 3, wherein
   a mass ratio CaO/SiO$_2$ of the calcium to the silicon in terms of CaO and SiO$_2$, respectively, is 0.2 or more and 0.8 or less.

5. The heat-dissipating member according to claim 1, further comprising:
   a surface, and projections at the surface.

6. The heat-dissipating member according to claim 5, wherein
   the projections are composed of aluminum oxide ceramics.

7. The heat-dissipating member according to claim 5, wherein
   an average diameter of the projections in a top view of the heat-dissipating member is 10 μm or more and 40 μm or less.

8. The heat-dissipating member according to claim 1, wherein
   the heat-dissipating member comprises a plate that comprises voids therein, and
   the plate further comprises first, second, and third segments in a thickness direction thereof, each segment having an equal thickness,
   wherein
   the second segment has more voids than the first segment and the third segment.

9. An electronic device, comprising:
   the heat-dissipating member according to claim 1; and
   an electronic component located on the heat-dissipating member.

* * * * *